(12) United States Patent
Wu et al.

(10) Patent No.: US 11,810,971 B2
(45) Date of Patent: Nov. 7, 2023

(54) INTEGRATED DESIGN FOR III-NITRIDE DEVICES

(71) Applicant: Transphorm Technology, Inc., Goleta, CA (US)

(72) Inventors: Yifeng Wu, Goleta, CA (US); John Kirk Gritters, Santa Barbara, CA (US)

(73) Assignee: Transphorm Technology, Inc., Goleta, CA (US)

( * ) Notice: Subject to any disclaimer, the term of this patent is extended or adjusted under 35 U.S.C. 154(b) by 0 days.

(21) Appl. No.: 17/047,602

(22) PCT Filed: Mar. 20, 2020

(86) PCT No.: PCT/US2020/024015
§ 371 (c)(1),
(2) Date: Oct. 14, 2020

(87) PCT Pub. No.: WO2020/191357
PCT Pub. Date: Sep. 24, 2020

(65) Prior Publication Data
US 2021/0408273 A1    Dec. 30, 2021

Related U.S. Application Data

(60) Provisional application No. 62/821,946, filed on Mar. 21, 2019.

(51) Int. Cl.
*H01L 29/778* (2006.01)
*H01L 23/48* (2006.01)
*H01L 29/20* (2006.01)

(52) U.S. Cl.
CPC ........ *H01L 29/7786* (2013.01); *H01L 23/481* (2013.01); *H01L 29/2003* (2013.01)

(58) Field of Classification Search
CPC  H01L 23/481; H01L 29/2003; H01L 29/7786
See application file for complete search history.

(56) References Cited

U.S. PATENT DOCUMENTS 6,476,431 B1 * 11/2002  Ohno ................... H01L 29/812
257/280
6,825,559 B2 * 11/2004  Mishra ................. H01L 23/367
257/728

(Continued)

FOREIGN PATENT DOCUMENTS

| TW | 201603239 | 1/2016 |
|---|---|---|
| TW | 201714307 | 4/2017 |
| TW | 201909423 | 3/2019 |

OTHER PUBLICATIONS

Barr et al., "High Voltage GaN Switch Reliability," WIPDA Conference, Atlanta, GA, Nov. 2018, 7 pages.

(Continued)

*Primary Examiner* — Jay C Kim
(74) *Attorney, Agent, or Firm* — Fish & Richardson P.C.

(57) ABSTRACT

A semiconductor device comprises a III-N device and a Field Effect Transistor (FET). The III-N device comprises a substrate on a first side of a III-N material structure, a first gate, a first source, and a first drain on a side of the III-N material structure opposite the substrate. The FET comprises a second semiconductor material structure, a second gate, a second source, and a second drain, and the second source being on an opposite side of the second semiconductor material structure from the second drain. The second drain of the FET is directly contacting and electrically connected to the first source of the III-N devices, and a via-hole is formed through a portion of the III-N material structure exposing a portion of the top surface of the substrate and the first gate is electrically connected to the substrate through the via-hole.

13 Claims, 12 Drawing Sheets

(56) References Cited

U.S. PATENT DOCUMENTS

| | | | |
|---|---|---|---|
| 7,291,872 B2 * | 11/2007 | Hikita | H01L 29/41766 257/192 |
| 7,339,207 B2 * | 3/2008 | Murata | H01L 29/4175 257/192 |
| 7,795,642 B2 | 9/2010 | Suh et al. | |
| 7,825,435 B2 * | 11/2010 | Machida | H03K 17/74 257/195 |
| 7,838,907 B2 * | 11/2010 | Shiraishi | H01L 29/861 257/195 |
| 7,851,825 B2 | 12/2010 | Suh et al. | |
| 7,875,907 B2 | 1/2011 | Honea et al. | |
| 7,884,394 B2 | 2/2011 | Wu et al. | |
| 7,898,004 B2 | 3/2011 | Wu et al. | |
| 7,915,643 B2 | 3/2011 | Suh et al. | |
| 7,915,645 B2 * | 3/2011 | Briere | H01L 29/2003 257/195 |
| 7,939,391 B2 | 5/2011 | Suh et al. | |
| 7,965,126 B2 | 6/2011 | Honea et al. | |
| 7,972,915 B2 | 7/2011 | Chen et al. | |
| 7,982,242 B2 * | 7/2011 | Goto | H01L 29/42316 257/200 |
| 8,003,975 B2 * | 8/2011 | Ueda | H01L 23/66 257/20 |
| 8,138,529 B2 | 3/2012 | Wu | |
| 8,178,898 B2 * | 5/2012 | Ikeda | H01L 29/41766 257/190 |
| 8,193,562 B2 | 6/2012 | Suh et al. | |
| 8,237,198 B2 | 8/2012 | Wu et al. | |
| 8,289,065 B2 | 10/2012 | Honea et al. | |
| 8,344,424 B2 | 1/2013 | Suh et al. | |
| 8,389,977 B2 | 3/2013 | Chu et al. | |
| 8,390,000 B2 | 3/2013 | Chu et al. | |
| 8,431,965 B2 | 4/2013 | Takemae | |
| 8,455,931 B2 | 6/2013 | Wu | |
| 8,493,129 B2 | 7/2013 | Honea et al. | |
| 8,508,281 B2 | 8/2013 | Honea et al. | |
| 8,519,438 B2 | 8/2013 | Mishra et al. | |
| 8,530,996 B2 | 9/2013 | Shono | |
| 8,531,232 B2 | 9/2013 | Honea et al. | |
| 8,536,622 B2 | 9/2013 | Takemae et al. | |
| 8,541,815 B2 | 9/2013 | Takemae et al. | |
| 8,541,818 B2 | 9/2013 | Wu et al. | |
| 8,569,124 B2 | 10/2013 | Akiyama et al. | |
| 8,581,300 B2 | 11/2013 | Yamada | |
| 8,592,974 B2 | 11/2013 | Wu | |
| 8,598,937 B2 | 12/2013 | Lal et al. | |
| 8,603,880 B2 | 12/2013 | Yamada | |
| 8,614,464 B2 * | 12/2013 | Jeon | H01L 21/8252 257/223 |
| 8,624,662 B2 | 1/2014 | Parikh et al. | |
| 8,633,517 B2 | 1/2014 | Kamada | |
| 8,633,518 B2 | 1/2014 | Suh et al. | |
| 8,643,062 B2 | 2/2014 | Parikh et al. | |
| 8,648,643 B2 | 2/2014 | Wu | |
| 8,664,927 B2 | 3/2014 | Shono | |
| 8,675,326 B2 | 3/2014 | Shono | |
| 8,692,294 B2 | 4/2014 | Chu et al. | |
| 8,716,141 B2 | 5/2014 | Dora et al. | |
| 8,742,459 B2 | 6/2014 | Mishra et al. | |
| 8,742,460 B2 | 6/2014 | Mishra et al. | |
| 8,766,711 B2 | 7/2014 | Takemae | |
| 8,772,842 B2 | 7/2014 | Dora | |
| 8,773,176 B2 | 7/2014 | Miyazaki et al. | |
| 8,786,327 B2 | 7/2014 | Honea et al. | |
| 8,803,246 B2 | 8/2014 | Wu et al. | |
| 8,816,497 B2 | 8/2014 | Wu | |
| 8,816,751 B2 | 8/2014 | Honea et al. | |
| 8,836,301 B2 | 9/2014 | Shono | |
| 8,836,308 B2 | 9/2014 | Shono | |
| 8,836,380 B2 | 9/2014 | Takemae | |
| 8,841,702 B2 | 9/2014 | Mishra et al. | |
| 8,847,283 B2 | 9/2014 | Kamada et al. | |
| 8,853,742 B2 * | 10/2014 | Yoshioka | H01L 29/4175 257/192 |
| 8,860,495 B2 | 10/2014 | Lal et al. | |
| 8,878,248 B2 | 11/2014 | Ishiguro et al. | |
| 8,878,571 B2 | 11/2014 | Takemae | |
| 8,883,581 B2 | 11/2014 | Ohki | |
| 8,890,206 B2 | 11/2014 | Yamada | |
| 8,890,314 B2 | 11/2014 | Wu | |
| 8,895,421 B2 | 11/2014 | Parikh et al. | |
| 8,895,423 B2 | 11/2014 | Dora | |
| 8,901,604 B2 | 12/2014 | Mishra et al. | |
| 8,912,839 B2 | 12/2014 | Honea et al. | |
| 8,933,489 B2 | 1/2015 | Kikkawa | |
| 8,952,750 B2 | 2/2015 | Wu | |
| 8,957,453 B2 | 2/2015 | Yamada et al. | |
| 8,962,409 B2 | 2/2015 | Tomabechi | |
| 9,006,787 B2 | 4/2015 | Yamada | |
| 9,035,356 B2 | 5/2015 | Yamada | |
| 9,041,435 B2 | 5/2015 | Honea et al. | |
| 9,041,465 B2 | 5/2015 | Bouisse | |
| 9,053,964 B2 * | 6/2015 | Jeon | H01L 27/085 |
| 9,059,076 B2 | 6/2015 | Wu et al. | |
| 9,059,136 B2 | 6/2015 | Kamada et al. | |
| 9,087,718 B2 | 7/2015 | Lal | |
| 9,087,812 B2 * | 7/2015 | Briere | H01L 27/0255 |
| 9,093,366 B2 | 7/2015 | Mishra et al. | |
| 9,099,351 B2 | 8/2015 | Nishimori et al. | |
| 9,099,545 B2 | 8/2015 | Akiyama et al. | |
| 9,099,564 B2 * | 8/2015 | Saito | H01L 29/4175 |
| 9,111,961 B2 | 8/2015 | Chu et al. | |
| 9,136,107 B2 | 9/2015 | Katani et al. | |
| 9,142,550 B2 * | 9/2015 | Prechtl | H01L 29/1079 |
| 9,142,638 B2 | 9/2015 | Yamada | |
| 9,142,658 B2 | 9/2015 | Kikkawa et al. | |
| 9,147,760 B2 | 9/2015 | Mishra et al. | |
| 9,165,766 B2 | 10/2015 | Keller et al. | |
| 9,171,730 B2 | 10/2015 | Chowdhury et al. | |
| 9,171,836 B2 | 10/2015 | Lal et al. | |
| 9,171,910 B2 | 10/2015 | Wu et al. | |
| 9,184,275 B2 | 11/2015 | Mishra et al. | |
| 9,190,295 B2 | 11/2015 | Wu | |
| 9,196,716 B2 | 11/2015 | Mishra et al. | |
| 9,209,176 B2 | 12/2015 | Wu et al. | |
| 9,224,671 B2 | 12/2015 | Parikh et al. | |
| 9,224,721 B2 | 12/2015 | Wu | |
| 9,224,805 B2 | 12/2015 | Mishra et al. | |
| 9,231,075 B2 | 1/2016 | Yamada | |
| 9,244,848 B2 | 1/2016 | Boyd et al. | |
| 9,245,992 B2 | 1/2016 | Keller et al. | |
| 9,245,993 B2 | 1/2016 | Keller et al. | |
| 9,257,424 B2 * | 2/2016 | Hirler | H01L 29/267 |
| 9,257,547 B2 | 2/2016 | Fichtenbaum et al. | |
| 9,293,458 B2 | 3/2016 | Parikh et al. | |
| 9,293,561 B2 | 3/2016 | Mishra et al. | |
| 9,299,822 B2 | 3/2016 | Kikkawa | |
| 9,318,593 B2 | 4/2016 | Wu et al. | |
| 9,343,560 B2 | 5/2016 | Suh et al. | |
| 9,349,805 B2 | 5/2016 | Ito et al. | |
| 9,356,017 B1 * | 5/2016 | Siemieniec | H01L 29/7786 |
| 9,362,903 B2 | 6/2016 | Wu et al. | |
| 9,373,699 B2 | 6/2016 | Chu et al. | |
| 9,397,089 B2 * | 7/2016 | Pan | H01L 29/7786 |
| 9,401,341 B2 | 7/2016 | Wu | |
| 9,406,674 B2 | 8/2016 | Briere | |
| 9,425,268 B2 | 8/2016 | Minoura et al. | |
| 9,437,707 B2 | 9/2016 | Mishra et al. | |
| 9,437,708 B2 | 9/2016 | Mishra et al. | |
| 9,443,849 B2 | 9/2016 | Wu et al. | |
| 9,443,938 B2 | 9/2016 | Mishra et al. | |
| 9,490,324 B2 | 11/2016 | Mishra et al. | |
| 9,496,137 B2 | 11/2016 | Chu et al. | |
| 9,520,491 B2 | 12/2016 | Chowdhury et al. | |
| 9,536,966 B2 | 1/2017 | Ogino | |
| 9,536,967 B2 | 1/2017 | Kikkawa et al. | |
| 9,537,425 B2 | 1/2017 | Honea | |
| 9,543,940 B2 | 1/2017 | Wang et al. | |
| 9,590,060 B2 | 3/2017 | Lal | |
| 9,590,494 B1 | 3/2017 | Zhou et al. | |
| 9,607,876 B2 * | 3/2017 | Lidow | H01L 21/8258 |
| 9,620,616 B2 | 4/2017 | Yamada et al. | |
| 9,634,100 B2 | 4/2017 | Mishra et al. | |

(56) References Cited

U.S. PATENT DOCUMENTS

| | | | |
|---|---|---|---|
| 9,640,648 B2 | 5/2017 | Kikkawa | |
| 9,654,004 B1* | 5/2017 | Deligianni | H01L 28/10 |
| 9,660,640 B2 | 5/2017 | Wang et al. | |
| 9,685,323 B2 | 6/2017 | Keller et al. | |
| 9,685,338 B2 | 6/2017 | Minoura et al. | |
| 9,690,314 B2 | 6/2017 | Honea et al. | |
| 9,741,702 B2 | 8/2017 | Wu | |
| 9,818,686 B2 | 11/2017 | Wu et al. | |
| 9,818,840 B2 | 11/2017 | Kikkawa | |
| 9,831,315 B2 | 11/2017 | Chu et al. | |
| 9,842,922 B2 | 12/2017 | Mishra et al. | |
| 9,847,394 B2* | 12/2017 | Prechtl | H01L 29/2003 |
| 9,865,719 B2 | 1/2018 | Keller et al. | |
| 9,899,998 B2 | 2/2018 | Honea et al. | |
| 9,935,190 B2 | 4/2018 | Wu et al. | |
| 9,941,399 B2 | 4/2018 | Mishra et al. | |
| 9,991,373 B1* | 6/2018 | Birner | H01L 29/7786 |
| 9,991,884 B2 | 6/2018 | Wang et al. | |
| 10,043,896 B2 | 8/2018 | Mishra et al. | |
| 10,043,898 B2 | 8/2018 | Lal | |
| 10,063,138 B1 | 8/2018 | Zhou et al. | |
| 10,680,069 B2* | 6/2020 | Haeberlen | H01L 29/41766 |
| 10,991,722 B2* | 4/2021 | Lee | H01L 29/7786 |
| 11,088,688 B2* | 8/2021 | Pala | H01L 29/2003 |
| 2012/0223321 A1 | 9/2012 | Lin et al. | |
| 2012/0256190 A1 | 10/2012 | McDonald et al. | |
| 2013/0009165 A1 | 1/2013 | Park et al. | |
| 2014/0042452 A1 | 2/2014 | Pendharkar et al. | |
| 2014/0264431 A1 | 9/2014 | Lal | |
| 2015/0162326 A1 | 6/2015 | Lin et al. | |
| 2016/0064313 A1 | 3/2016 | Denison et al. | |
| 2016/0079223 A1 | 3/2016 | Wu | |
| 2020/0135766 A1* | 4/2020 | Dutta | H01L 21/0254 |

OTHER PUBLICATIONS

Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "ZrO$_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Huang and Cuadra, "Preventing GaN Device VHF Oscillation," APEC 2017 Industry Session, Mar. 2017, 25 pages.
Keller et al., "GaN—GaN Junctions with Ultrathin AlN Interlayers: Expanding Heterojunction Design," Applied Physics Letters, 2002, 80(23):4387-4389.
Mishra et al., "AlGaN/GaN HEMTs—An Overview of Device Operation and Applications," Proceedings of the IEEE, 2002, 90(6):1022-1031.
Parikh et al., "Commercialization of High 600V GaN-on-Silicon Power HEMTs and Diodes," 2013 IEEE, 5 pages.
Parikh, "Driving the Adoption of High-voltage Gallium Nitride Filed-effect Transistors," IEEE Power Electronics Magazine, Sep. 2017, 3 pages.
Parikh et al., "650 Volt GaN Commercialization Reaches Automotive Standards," ECS Transactions, 2017, 80(7):17-28.
Shen, "Advanced Polarization-based Design of AlGaN/GaN HEMTs," Jun. 2004, PhD Thesis, University of California, Santa Barbara, 192 pages.
Smith and Barr, "Reliability Lifecycle of GaN Power Devices," Transphorm Inc., Mar. 2017, 8 pages.
Suh et al. "High-Breakdown Enhancement-mode AlGaN/GaN HEMTs with Integrated Slant Field-Plate," Electron Devices Meeting, 2006, IEDM '06 International, 3 pages.
Wang et al., "Investigation of Driver Circuits for GaN HEMTs in Leaded Packages," Workshop on Wide Bandgap Power Devices and Applications (WiPDA), 2014 IEEE, pp. 81-87.
Wang, et al., "Design and Implementation of a High-efficiency Three-level Inverter Using GaN HEMTs," PCIM Europe 2015, May 19-21, 2015, Nuremberg, Germany, 7 pages.
Wang et al., "Paralleling GaN HEMTs for Diode-free Bridge Power Converters," 2015 IEEE Applied Power Electronics Conference and Exposition (APEC), Charlotte, NC, 2015, pp. 752-758.
Wu, "AlGaN/GaN Microwave Power High-Mobility Transistors," PhD Thesis, University of California, Santa Barbara, Jul. 1997, 134 pages.
Wu, "Paralleling High-speed GaN Power HEMTs for Quadrupled Power Output," Applied Power Electronics Conference and Exposition (APEC), 2013, pp. 211-214.
Wu et al., "A 97.8% Efficient GaN HEMT Boost Converter with 300-W Output Power at 1 MHz," Electronic Device Letters, 2008, IEEE, 29(8):824-826.
Wu et al., "High-frequency, GaN Diode-free Motor Drive Inverter with Pure Sine Wave Output," PCIM Europe 2012, Conference Digest, pp. 40-43.
Wu et al., "Total GaN Solution to Electrical Power Conversion," the 69th IEEE Device Research Conference, Conference Digest, Jun. 20-22, 2011, pp. 217-218.
Wu et al., "Advances in Reliability and Operation Space of High-voltage GaN Power Devices on Si Substrates," (2014) IEEE, 3 pages.
Wu et al., "kV-Class GaN-on-Si HEMTs Enabling 99% Efficiency Converter at 800 V and 100 kHz," IEEE Transactions on Power Electronics. 2014 29(6):2634-2637.
Xu et al., "Investigation of 600 V GaN HEMTs for High Efficiency and High Temperature Applications," Applied Power Electronics Conference and Exposition (APEC), Apr. 2014, pp. 131-136.
Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.
Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.
Zhang, "High Voltage GaN HEMTs with Low On-resistance for Switching Applications," PhD Thesis, University of California, Santa Barbara, Sep. 2002, 166 pages.
Zhang et al., "Gate Drive Design Considerations for High Voltage Cascode GaN HEMT," Applied Power Electronics Conference and Exposition (APEC), Mar. 2014, pp. 1484-1489.
Zhang et al., "Impact of Interleaving on AC Passive Components of Paralleled Three-phase Voltage-source Converters," IEEE Transactions on Industry Applications, May/Jun. 2010, 46(3):1042-1054.
Zhou et al., "High-efficiency True Bridgeless Totem Pole PFC Based on GaN HEMTs: Design Challenges and Cost-effective Solution," PCIM Europe 2015, pp. 1482-1489.
Zhou and Wu, "99% Efficiency True-bridgeless Totem-pole PFC Based on GaN HEMTs," PCIM Europe May 14-16, 2013, pp. 1017-1022.
Zuk and Campeau, "How to Design with GaN in 1 Hour!," APEC 2017 Exhibitor Session, Mar. 2017, 24 pages.
Extended European Search Report in European Appln. No. 20774117.4, dated May 8, 2023, 11 pages.
Office Action in Taiwanese Appln. No. 109109618, dated Jul. 13, 2023, 11 pages (with English Search Report).

* cited by examiner

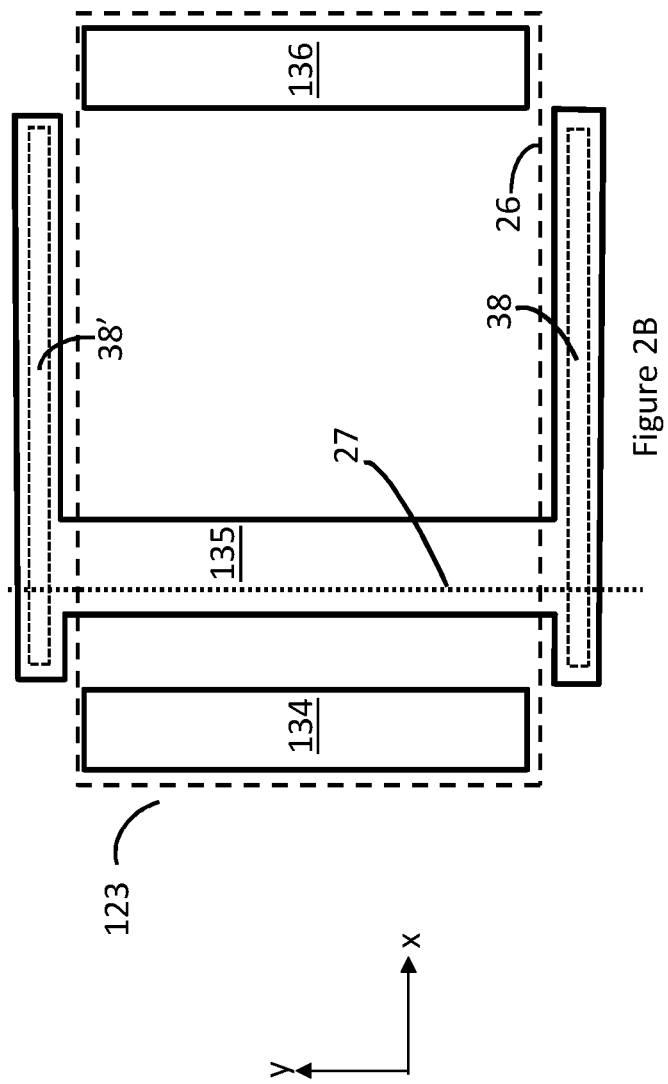

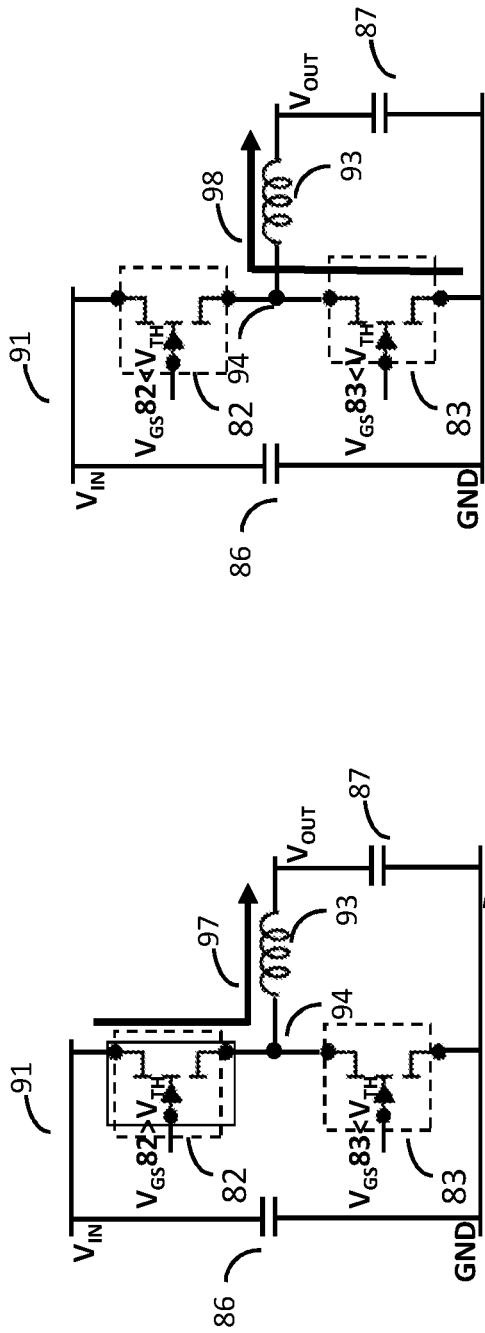
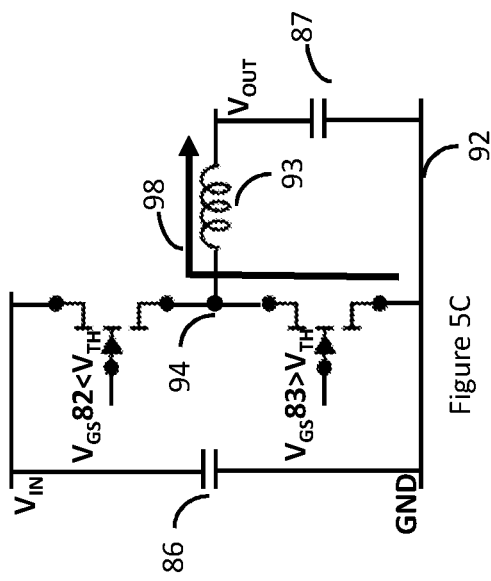

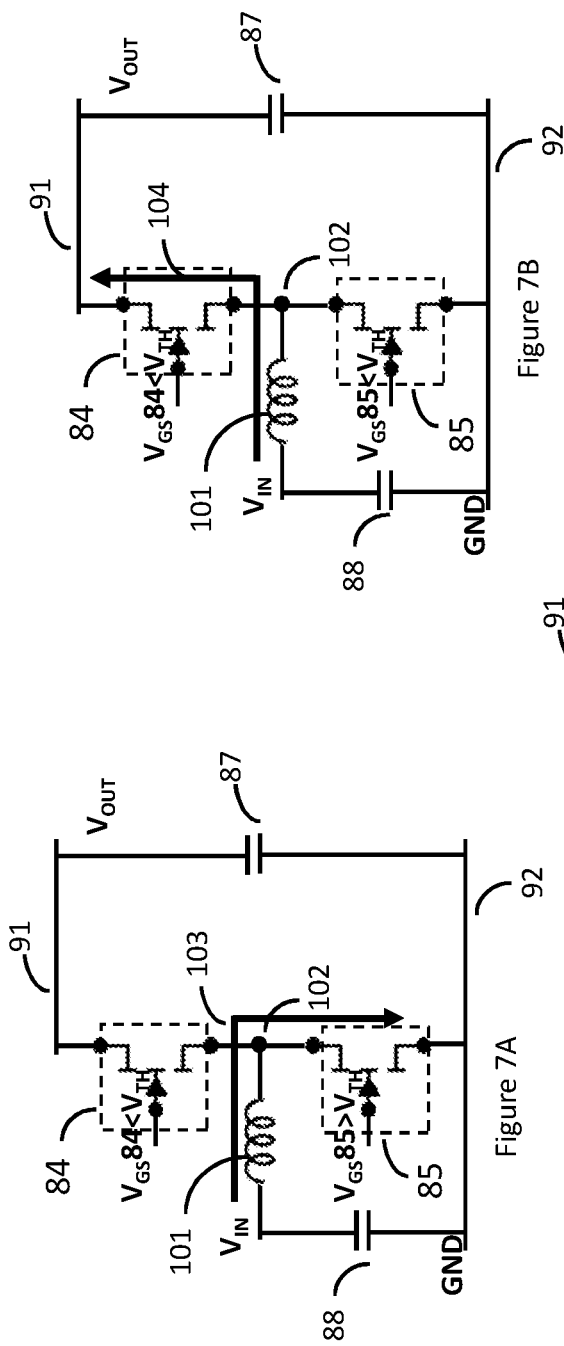
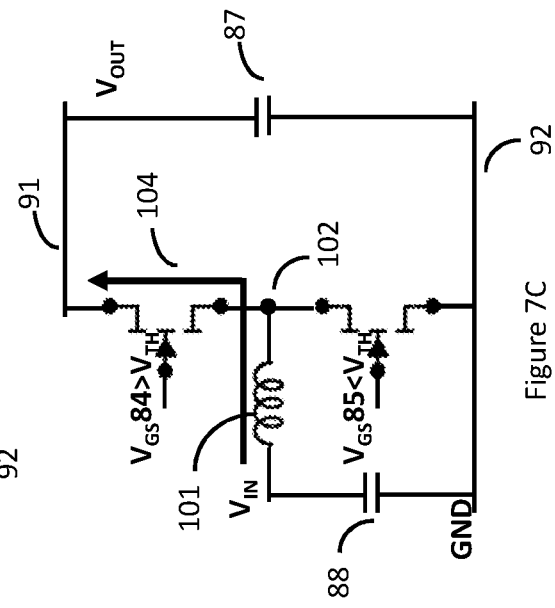
Figure 7A
Figure 7B
Figure 7C

INTEGRATED DESIGN FOR III-NITRIDE DEVICES

CROSS-REFERENCE TO RELATED APPLICATIONS

This application is a National Stage Application under 35 U.S.C. § 371 and claims the benefit of International Application No. PCT/US2020/024015, filed Mar. 20, 2020, which application claims priority to U.S. Provisional Application Ser. No. 62/821,946, filed Mar. 21, 2019. The disclosure of each of the foregoing applications is incorporated herein by reference.

TECHNICAL FIELD

The disclosed technologies relate to semiconductor electronic devices designed to achieve increased performance and reliability.

BACKGROUND

Currently, typical power semiconductor devices, including devices such as transistors, diodes, power MOSFETs and insulated gate bipolar transistors (IGBTs), are fabricated with silicon (Si) semiconductor material. More recently, wide-bandgap materials (SiC, III-O, diamond) have been considered for power devices due to their superior properties. III-Nitride or III-N semiconductor devices, such as gallium nitride (GaN) devices, are now emerging as attractive candidates to carry large currents, support high voltages, and provide very low on-resistance with fast switching times.

Most conventional III-N high electron mobility transistors (HEMTs) and related transistor devices are normally on (i.e. have a negative threshold voltage), which means that they can conduct current at zero gate voltage. These devices with negative threshold voltages are known as depletion-mode (D-mode) devices. It is preferable in power electronics to have normally off devices (i.e. devices with positive threshold voltages), that do not conduct substantial current at zero gate voltage, in order to avoid damage to the device or to other circuit components by preventing accidental turn on of the device. Normally off devices are commonly referred to as enhancement-mode (E-mode) devices.

Reliable fabrication and manufacturing of high-voltage III-N E-mode transistors has thus far proven to be very difficult. One alternative to a single high-voltage E-mode transistor is to combine a high-voltage D-mode III-N transistor with a low-voltage E-mode transistor, for example a low voltage silicon FET, in a cascode circuit configuration shown in the schematic diagram of FIG. 1 to form a hybrid device, which can be operated in the same way as a single high-voltage E-mode III-N transistor and in many cases achieves the same or similar output characteristics as a single high-voltage E-mode III-N transistor. The hybrid device of FIG. 1 includes a high-voltage D-mode III-N transistor 23 and a low-voltage E-mode transistor 22 which optionally can both be encased in a single package 10, the package includes a source lead 11, a gate lead 12, and a drain lead 13. The source electrode 31 of the low-voltage E-mode transistor 22 and the gate electrode 35 of the high-voltage D-mode III-N transistor 23 are electrically connected to the source lead 11. The gate electrode 32 of the low-voltage E-mode transistor 22 is electrically connected to the gate lead 12. The drain electrode 36 of the high-voltage D-mode III-N transistor 23 is electrically connected to the drain lead 13. The source electrode 34 of the high-voltage D-mode III-N transistor 23 is electrically connected to the drain electrode 33 of the low-voltage E-mode transistor 22. The low-voltage E-mode transistor 22 includes an intrinsic body diode 37 which runs anti-parallel to the channel of the transistor 22.

SUMMARY

Described herein are integrated designs for III-N devices, for which a low-voltage enhancement-mode device and a high-voltage depletion-mode III-N device are integrated into a single electronic component package to form a hybrid device, which can be operated in the same way and/or have the same output characteristics as a single high-voltage E-mode III-N transistor. The term device will be used in general for any transistor or switch or diode when there is no need to distinguish between them.

In a first aspect, a semiconductor device is described. The semiconductor devices comprises a III-N device and a Field Effect Transistor (FET). The III-N device comprises a substrate on a first side of a III-N material structure, a first gate, a first source, and a first drain on a side of the III-N material structure opposite the substrate. The FET comprises a second semiconductor material structure, a second gate, a second source, and a second drain, and the second source being on an opposite side of the second semiconductor material structure from the second drain. The second drain of the FET is directly contacting and electrically connected to the first source of the III-N devices, and a via-hole is formed through a portion of the III-N material structure exposing a portion of the top surface of the substrate and the first gate is at least partially formed in the via-hole and electrically connected to the substrate.

In a second aspect, and electronic component is described. The electronic component comprises an enhancement-mode transistor. The electronic component further comprises a depletion-mode transistor. The depletion-mode transistor comprises a substrate. The electronic component further comprises a package. The package comprises a conductive structural package base, and the packages encloses both the enhancement-mode transistor and the depletion-mode transistor. A drain electrode of the depletion-mode transistor is electrically connected to a drain lead of the package, a gate electrode of the enhancement-mode transistor is electrically connected to a gate lead of the package, a source electrode of the enhancement-mode transistor is electrically connected to the conductive structural package base, where a gate electrode of the depletion-mode transistor directly contacts and is electrically connected to the conductive substrate, the conductive substrate is directly contacting and electrically connected to the conductive structural package base, and the conductive structural package base is electrically connected to a source lead of the package.

In a third aspect, a half bridge circuit is described. The half bridge circuit comprises a high-side switch connected to a high voltage node, a low-side switch connected to a ground node, and an inductor connected to a node between the high-side switch and the low-side switch. The low-side switch comprises a low voltage enhancement-mode transistor and a high voltage depletion-mode transistor. The half bride circuit is configured such that in a first mode of operation current flows through the high-side switch in a first direction and through the inductor while the high-side switch is biased ON and the low-side switch is biased OFF. In a second mode of operation current flows through the low-side switch in a second direction and through the inductor while the high-side switch is biased OFF and the low-side switch is biased OFF. In a third mode of operation current flows through the low-side switch in the second direction and through the inductor while the high-side switch is biased OFF and the low-side switch is biased ON, where during the second mode of operation, a reverse DC current through the low-side switch is greater than 50 A, and where during the third mode of operation an increase in on-resistance of the III-N depletion-mode transistor is less than 5%.

In a fourth aspect, an electronic component encased in a package is described. The electronic component comprises a hybrid III-N device. The hybrid III-N device comprises a low-voltage enhancement-mode transistor and a high-voltage III-N depletion-mode transistor arranged in a cascode configuration. The packaged electronic component is capable of blocking 600V in a forward direction, and capable of withstanding current greater than 50 A in a reverse direction while a gate of the component package is biased OFF, where a resistance of the electronic component while the gate is biased ON is less than 5% after withstanding said current in a reverse direction while the gate of the electronic component is biased OFF.

Each of the devices and transistors described herein can include one or more of the following features. The substrate can be doped p-type with a hole concentration greater than $1 \times 10^{19}$ holes/cm$^3$. The substrate can be electrically couple to a circuit ground. The III-N buffer layer can have a thickness greater than 4 μm and capable of blocking greater than 600V. The drain of the FET can be electrically connected to the source of the III-N device by solder, solder paste or conductive epoxy. The gate electrode metal can include Ti/Al or Ni/Au. The III-N material structure can be orientated in a Ga-polar orientation or a N-polar orientation. The drain electrode of the enhancement-mode transistor is directly contacting and electrically connected to the source electrode of the depletion-mode transistor. The source electrode of the enhancement-mode transistor is coupled to the gate electrode of the depletion-mode transistor through the conductive substrate. The enhancement-mode transistor has a lower breakdown voltage than the depletion-mode transistor. The gate electrode of the III-N depletion-mode transistor can be electrically connected to a silicon substrate. The silicon substrate can be directly contacting and electrically connected to a conductive structural package base, and the structural package base is configured to be connected to a circuit ground. The enhancement-mode transistor can be a silicon MOSFET.

As used herein, a "hybrid enhancement-mode electronic device or component", or simply a "hybrid device or component", is an electronic device or component formed of a depletion-mode transistor and an enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \leq w \leq 1$, $0 \leq x \leq 1$, $0 \leq y \leq 1$, and $0 \leq z \leq 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance (Rory) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, or other suitable blocking voltage required by the application. For a bidirectional or four quadrant switch, the blocked voltage could be of any polarity less a certain maximum when the switch is OFF (±$V_{max}$ such as ±300V or ±600V, ±1200V and so on), and the current can be in either direction when the switch is ON.

As used herein, a "III-N device" is a device based on III-N heterostructures. The III-N device can be designed to operate as a transistor or switch in which the state of the device is controlled by a gate terminal or as a two terminal device that blocks current flow in one direction and conducts in another direction without a gate terminal. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

In typical power switching applications in which high-voltage switching transistors are used, the transistor is during the majority of time in one of two states. In the first state, which is commonly referred to as the "ON state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "OFF state", the voltage at the gate electrode relative to the source electrode is lower than the transistor threshold voltage, and no substantial current, apart from off-state leakage current, flows through the transistor. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the transistor. In some applications, inductive elements in the circuit cause the voltage between the source and drain to be even higher than the circuit high voltage supply. Additionally, there are short times immediately after the gate has been switched on or off during which the transistor is in a transition mode between the two states described above. When the transistor is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

When the hybrid enhancement-mode device of FIG. 1 is used in place of a conventional high-voltage E-mode transistor, the hybrid device operates as follows. When the hybrid device is in the on state, current flows through both the channel of the E-mode transistor and the channel of the D-mode transistor, and the voltage across each of the two transistors can be small, typically a few volts or less. When the hybrid device is in the off state, the voltage blocked by the hybrid device is divided between the E-mode transistor and the D-mode transistor. The E-mode transistor blocks a voltage approximately between |$V_{th,D}$| and $V_{br,E}$, where |$V_{th,D}$| is the absolute value of the threshold voltage of the D-mode transistor, and $V_{br,E}$ is the breakdown voltage of the E-mode transistor. The remainder of the voltage across the hybrid device is blocked by the high-voltage D-mode transistor.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

FIGS. 2B and 2C are a plan view and cross-sectional view, respectively, of the hybrid III-N device of FIG. 2A.

FIGS. 5A, 5B, and 5C show schematic diagrams of current paths through a half-bridge buck converter circuit.

FIGS. 7A, 7B and 7C show schematic diagrams of current paths through a half-bridge boost converter circuit.

Like reference symbols in the various drawings indicate like elements.

DETAILED DESCRIPTION

Described herein are hybrid enhancement-mode electronic components, which include a depletion-mode transistor and an enhancement mode transistor assembled into a single electronic component package. The depletion-mode transistor, which can be a high-voltage III-N device, and the enhancement-mode transistor, which can be a low-voltage silicon FET device are arranged in a cascode circuit configuration to form a hybrid device, which can be operated in the same way as a single high-voltage E-mode III-N transistor and in many cases achieves the same or similar output characteristics as a single high-voltage E-mode III-N transistor. The depletion-mode transistor has a larger breakdown voltage than the enhancement-mode transistor (e.g. at least three times larger). The maximum voltage that can be blocked by the hybrid electronic components when they are biased in the off state is at least as large as the maximum blocking or breakdown voltage of the depletion-mode transistor. The hybrid electronic components described herein are configured such that reliability and/or performance are improved as compared to conventional hybrid devices in a package, while reducing the complexity and cost of the assembly process.

Figure 2A:
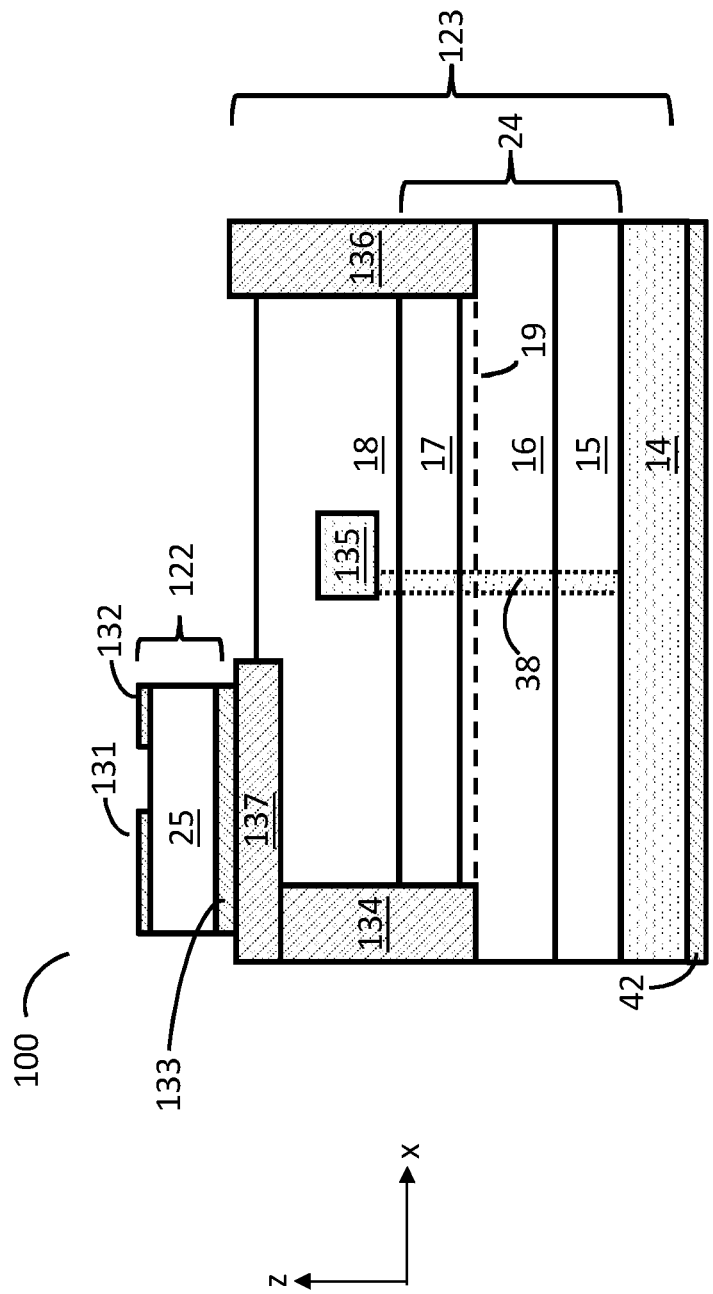
FIG. 2A is a cross-sectional view of a hybrid III-N device.

FIG. 2A shows a cross-sectional view of an electronic device which includes a low-voltage E-mode device 122 (e.g. a silicon FET device) electrically connected to a high-voltage D-mode III-N device 123 (e.g. a GaN HEMT device) to form a single high-voltage hybrid III-N device 100. The E-mode device 122 includes a semiconductor body layer 25, a FET source electrode 131 and a FET gate electrode 132 on a first side of the semiconductor body layer 25, and a FET drain electrode 133 on a side of the semiconductor body layer 25 opposite the FET source electrode 131.

The D-mode III-N device 123 of FIG. 2A includes a III-N material structure 24, for example a combination of GaN and AlGaN, grown on a suitable electrically conductive substrate 14, which can be an electrically conductive semiconductor such as silicon (e.g., p-type or n-type Si), GaN or any other sufficiently electrically conductive substrate. For example, the substrate can be doped p-type with a hole concentration greater than $1 \times 10^{19}$ holes/cm$^3$, or the substrate can be doped n-type with an electron concentration greater than $1 \times 10^{19}$ electrons/cm$^{-3}$. The substrate can have high thermal conductivity or low thermal conductivity; in the case of a low thermal conductivity substrate, the substrate can be thinned to improve thermal dissipation. The substrate can have a similar or different lattice constant and/or thermal expansion coefficient than that of any of the material layers of the III-N material structure 24. A back metal layer 42 (e.g. Ti/Ni/Ag) can be formed on the backside of the substrate opposite the III-N material structure 24. The back metal layer 42 can be used as a bonding layer to allow the substrate to be attached to a device package base (e.g. a lead frame), with solder, solder paste, conductive epoxy, conductive tape or other suitable attachment methods which allow for a high quality mechanical, thermal, and electrical connection of the device substrate 14 to a device package base.

The III-N material structure 24 can include a III-N buffer layer 15, for example GaN or AlGaN, grown over the substrate 14. The buffer layer 15 can be rendered insulating or substantially free of unintentional n-type mobile carriers by including dislocations or point defects in the layer, or by doping the layer with compensating elements, such as Fe, C, and/or Mg. The buffer layer can have a substantially uniform composition throughout, or the composition can vary. For example, in some implementations the buffer layer is compositionally graded, such as by grading the aluminum composition in the buffer layer (e.g., the substrate can be $Al_xG_{1-x}N$ with x varying throughout the substrate). The thickness and composition of the buffer layer 15 can be optimized for high-voltage applications. That is, the buffer layer is capable of blocking a voltage equal to the high-voltage supply or the maximum voltage in the circuit for which it is used. For example the buffer layer 15 may be capable of blocking greater than 600V, or greater than 900V. The thickness of the buffer layer 15 can be greater than 4 μm, for example the III-N buffer layer can have a thickness between 5 μm and 8 μm.

The III-N material structure can further include a III-N channel layer 16 (e.g., GaN) over the III-N buffer layer 15, and a III-N barrier layer 17 (e.g., AlGaN, AlInN, or AlGaInN) over the III-N channel layer 16. The bandgap of the III-N barrier layer 17 is greater than that of the III-N channel layer 16. The III-N channel layer 16 has a different composition than the III-N barrier layer 17, and the thickness and composition of the III-N barrier layer 17 is selected such that a two-dimensional electron gas (2DEG) channel 19 (indicated by the dashed line in FIG. 2A) is induced in the III-N channel layer 16 adjacent the interface between layers 17 and 16.

Typically, III-N high electron mobility transistors (HEMTs) are formed from epitaxial (i.e. epi) III-N material structures grown by molecular beam epitaxy (MBE) or metalorganic chemical vapor deposition (MOCVD) in a reactor or other techniques. The III-N material structures can be grown in a group-III polar (e.g., Ga-polar) orientation, such as the [0 0 0 1] (C-plane) orientation, as shown in FIG. 2A. That is, the source, gate, and drain contacts of the HEMT are formed over the group-III face (e.g., [0 0 0 1] face) of the III-N material structure, which is typically on an opposite side of the III-N material structure from the substrate on which the III-N layers are formed. Alternatively, III-N HEMTs can be formed on III-N material structures grown in an N-Polar (i.e., N-face) orientation, such as the [0 0 0 –1] orientation (not shown). In this case, the source, gate, and drain contacts of the HEMT are formed over the N-face (e.g., [0 0 0 –1] face) of the III-N material structure. Here, the III-N material structure can include a III-N barrier layer over the III-N buffer layer, and a III-N channel layer 16 over the III-N barrier layer 17. The bandgap of the III-N barrier layer 17 is greater than that of the III-N channel layer 16 and the thickness and composition of the III-N barrier layer 17 is selected such that a two-dimensional electron gas (2DEG) channel 19 is induced in the III-N channel layer 16 adjacent the interface between III-N channel layer 16 and the III-N barrier layer 17. N-polar III-N materials have polarization fields with opposite direction than group-III polar III-N materials, thus can enable the implementation of III-N devices which cannot be fabricated using group-III polar structures.

An insulator layer 18 (e.g. a dielectric layer) is grown or deposited over the top surface of the III-N material structure. The insulator 18 can, for example, be formed of or include Aluminum Oxide ($Al_2O_3$), Silicon Dioxide ($SiO_2$), $Si_xN_y$, $Al_{1-x}Si_xN$, $Al_{1-x}Si_xO$, $Al_{1-x}Si_xON$ or any other wide bandgap insulator. Although the insulator 18 is shown as a single layer, it can alternatively be formed out of several layers deposited during different processing steps to form a single combined insulator layer. The insulator layer 18 can be constant throughout or be formed of varying types of insulating material, for example, the insulator layer can have a first portion formed of MOCVD SiN (e.g., SiN deposited by MOCVD) and a second portion formed of PECVD SiN (e.g., SiN deposited by PECVD).

A source electrode 134 and a drain electrode 136 are formed on a side of the device 100 opposite the substrate, such that the device 100 is characterized as a lateral III-N device (i.e. the source and drain are on the same side of the device and current flows through the device laterally between the source 134 and the drain 136). The source electrode 134 and the drain electrode 136 are in ohmic contact and electrically connected to the device 2DEG channel 19 that is formed in layer 16. The source and drain electrodes 134, 136, e.g., source and drain contacts, can be formed by metal stacks. A recess can be formed in the III-N barrier layer 17 to allow for improved ohmic contact of the source and drain electrodes 134, 136 to the 2DEG channel 19. The metal stacks can be Ti/Al/Ni/Au, Ti/Al, or other suitable metals. The source and drain contacts 134, 136 can be formed by metal evaporation and post-deposition annealing processes. Other ohmic contact processes can also be used, including sputtering and dry etch processing.

The device 100 further includes a gate electrode 135, e.g. a gate contact. The gate electrode 135 can be formed such that the insulator layer 18 is at least partially between the gate electrode and the III-N material structure 24, as shown in FIG. 2A, or alternatively the gate electrode 135 can be formed such that it is in contact with the III-N material structure 24 (not shown). The gate electrode 135 can be formed of suitable conducting materials such as metal stacks, e.g., titanium/aluminum (Ti/Al) or nickel/gold (Ni/Au), and can be deposited by metal evaporation or sputtering or chemical vapor deposition or various atomic layer depositions (ALD). The gate electrode 135 may alternatively be another conductive material or material stack including one or more materials having a large work function, such as a semiconductor material having a large work function (e.g., p-type poly-silicon, indium tin oxide, tungsten nitride, indium nitride, or titanium nitride).

The gate electrode 135 is electrically connected to the substrate 14 by a via-hole 38 which is formed through a portion of the III-N material structure 24 (e.g. a through-epi-via or TEV) exposing a portion of the top surface of the substrate 14 as shown by a dashed region in FIG. 2A. The gate electrode 135's metal is at least partially formed in the via-hole 38 such that the gate electrode 135 of the III-N device 23 is electrically connected to the substrate 14. Although the dashed region in FIG. 2A shows the via-hole 38 passing through the 2DEG channel 19, the via-hole 38 is formed in a way such that the 2DEG channel 19 is continuous between the source electrode 134 and the drain electrode 136 (e.g. the via-hole is formed in a region outside an active region of the device) as further shown in FIGS. 2B, and 2C.

Figure 2C:
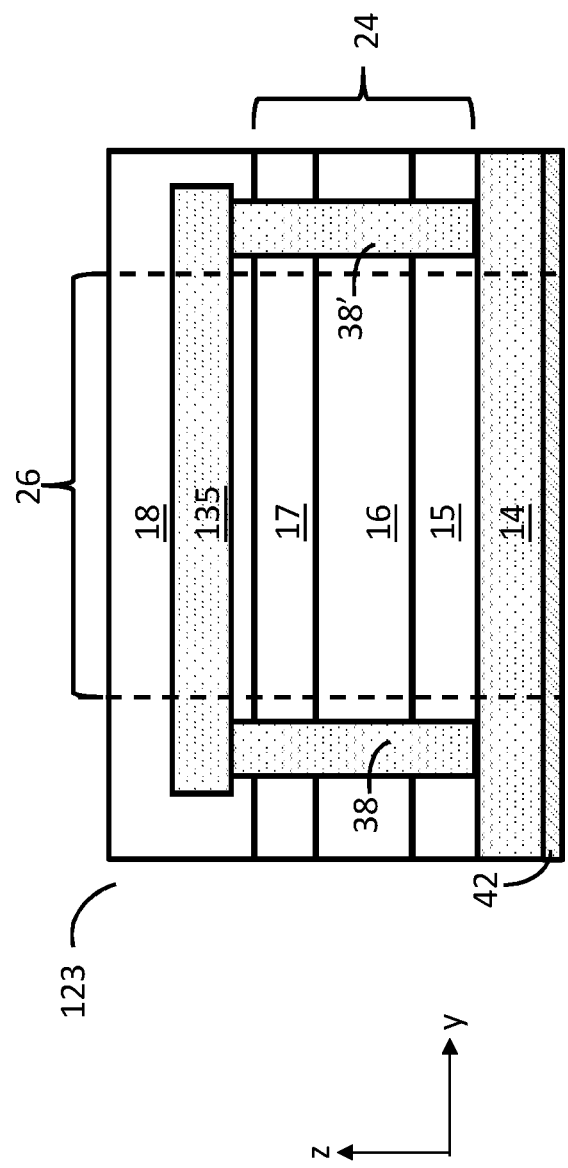

FIGS. 2B and 2C illustrate a plan view and a cross-sectional view, respectively, of the III-N device 123 of FIG. 2A where the cross-sectional view of FIG. 2C is indicated by the dashed line 27 of FIG. 2B. The active region of the device is indicated by the dashed area 26. Outside of the active region, the semiconductor material is typically etched or otherwise treated (e.g., by ion implantation) so that no conductive channel is present, thereby preventing shorts between portions of the device that are designed to be isolated from one another. As seen in FIGS. 2B and 2C, the via-holes 38 and 38' are formed outside the active region 26 and extend through the III-N material structure 24 exposing a portion of the top surface of the substrate 14. The gate electrode metal is at least partially formed in the via-hole 38 and 38' such that the gate electrode 135 is electrically connected to the substrate 14. As used herein, the "active region" of a transistor refers to the source and drain regions along with the region containing the device channel that is between the source and drain electrodes 134, 136, i.e., region 26, in FIGS. 2B and 2C.

Now, referring back to FIG. 2A, the low voltage E-mode device 122 is electrically connected to the high-voltage D-mode III-N device 123 to form the hybrid III-N device 100. Here, the drain electrode 133 of the E-mode device 122 is directly contacting (e.g. mounted on) and electrically connected to the source electrode 134 of the III-N device 123 though a portion of the source contact which is shown as a source pad 137 formed over a portion of the insulating layer 18. The source pad 137 can extend over the active region of the D-mode device 123, as shown in FIG. 2A, such that the E-mode device 122 is mounted directly over the active region of D-mode device 123. Alternatively, insulating layer 18 can extend outside the active region of D-mode device 123, the source pad 137 can extend over insulating layer 18 outside the active area of D-mode device 123, and E-mode device 122 can be mounted on the source pad 137 outside the active area of D-mode device 123. The drain 133 of the E-mode device 122 can be connected to the source pad 137 of the D-mode device 123, for example, with solder, solder paste, conductive epoxy, conductive tape or other suitable attachment methods which allow for a high quality mechanical, thermal, and electrical connection between the FET drain electrode 133 and the source pad 137 of source electrode 134. Conventional hybrid devices assembled in a single package are typically co-packed side-by-side on a ceramic insulating substrate, such as an AlN shim, and require an external wire connector to make the FET-drain to HEMT-source connection. However, directly mounting E-mode device 122 on the D-mode device 123, as shown in FIG. 2A, eliminates the need for an external wire connector and a ceramic substrate. This drastically reduces the parasitic inductance of the circuit, allowing for higher current ratings and faster switching speeds.

Figure 3:
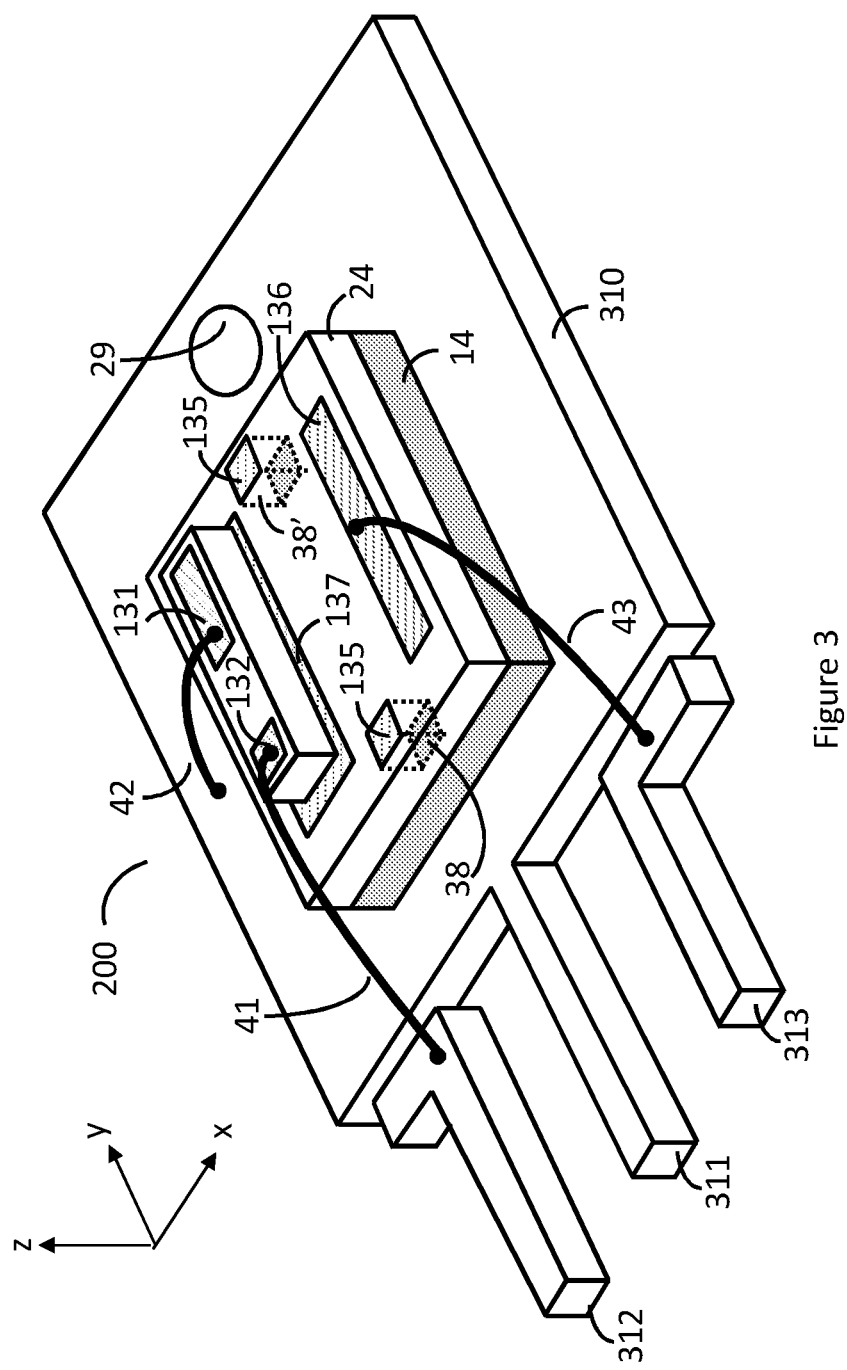
FIG. 3 is a perspective view of a packaged electronic component device.

FIG. 3 is a perspective view of the hybrid III-N device 100 integrated into an electronic component package 200. The package 200 is a three terminal package, comprising a conductive structural package base 310 (e.g. an Aluminum, Copper or Nickel lead frame), a gate lead 312 (i.e. first terminal), a source lead 311 (i.e. second terminal) and a drain lead 313 (i.e. third terminal), where the gate lead 312 and the drain lead 313 are electrically isolated from the conductive structural package base 310 and the source lead 311 is electrically connected to the conductive structural package base 310. A mounting hole 29 may optionally be included. Additionally, the package 200 can include a plastic or metal case (not shown) which encloses the device. The substrate 14 of the hybrid device is mounted directly and electrically connected to conductive structural package base 310. The substrate 14 can be mounted to the package base, for example, with solder, conductive epoxy, conductive tape or other suitable attachment methods which allow for a high quality mechanical, thermal, and electrical connection of the substrate 14 to the structural package base 310. Typically, in conventional hybrid device packaging approaches, a ceramic or insulating substrate (e.g. AlN shim) is used between the device substrate 14 and the package base 310 to electrically isolate the substrate from the package. The package base 310 can be mounted directly to a heat sink (not shown) such that the package base 310 and heat sink are in electrical and thermal contact, i.e., they are electrically connected, and heat generated by the hybrid device can dissipate through the heat sink. The heat sink can also be a circuit ground, or it can be electrically connected to a circuit ground, in which case the package base 310, the substrate 14, and the gate 135 of the III-N device are each electrically connected to circuit ground.

The gate lead 312 of the package 200 is coupled (e.g., electrically connected) by connector 41 to the gate electrode 132 of the E-mode device 122. The drain lead 313 of the package 200 is coupled (e.g., electrically connected) by connector 43 to the drain electrode 136 of the III-N device 123. The conductive structural package base 310 is coupled (e.g., electrically connected) by connector 42 to the source electrode 131 of the E-mode device 122. The gate electrode 135 of the III-N device 123 is coupled (e.g., electrically connected) to the conductive structural package base 310 through the conductive substrate 14 and the via-hole 38/38'. Connectors 41, 42, and 43 may comprise single wirebonds (as shown) or multiple parallel wirebonds, ribbons, conductive metal clips, or other connectors comprising conductive materials such as aluminum (Al), gold (Au), copper (Cu), or other appropriate materials.

As seen in FIG. 3, the gate contact 135 of the D-mode III-N device 123 is electrically connected to the substrate 14 by the via-hole 38/38' which is formed through the III-N material structure 24. Also, as previously described, the substrate 14 is directly mounted to the conductive structural package base 310, such that they are electrically connected. This configuration allows the gate electrode 135 of the III-N device to be electrically coupled (e.g., electrically connected) to the source lead 311 of the packaged device 200 without the use of an external wire connector, as required in conventional approaches. The configuration also allows the gate electrode 135 to be electrically coupled (e.g., electrically connected) to the source electrode 131 of the E-mode device 122. The gate electrode 135 may contain a contact pad region which is exposed on a top surface of the D-mode device 123 (as shown in FIG. 3) which may be practical for device testing (e.g. device probing), however it may be preferable to fully encapsulate the top surface of the gate electrode 135 in a dielectric material, such as the dielectric layer 18, so that there is no exposed area of the gate electrode 135 on the top surface of the D-mode device 123. In addition, conventional hybrid device assembly approaches typically use a ceramic or insulating shim (e.g., an AlN shim) between the device substrate 14 and the package base 310 to electrically isolate the substrate from the package source lead 311. This requires the use of an additional wire connector to connect the gate electrode 135 to the package source lead 311. When an insulating shim is included between the package base 310 and substrate 14 of the D-mode device, the substrate 14 is not held at a fixed voltage, but rather is at a floating potential (e.g. somewhere between the voltage of the D-mode device's gate 135 and the voltage of the D-mode device's drain 136), thereby resulting in a voltage difference between the D-mode device's drain 136 and the D-mode device's substrate 14 that is substantially less than the voltage difference between the D-mode device's drain 136 and the D-mode device's gate 135. Removing the ceramic shim and connecting substrate 14 to the package base 310 pins the substrate voltage at 0V (i.e. ground potential) resulting in the full gate-drain voltage being held across the III-N buffer layer 15. As such, careful design considerations need to be made with regards to the III-N buffer layer 15 to maintain sufficient device breakdown voltage characteristics (e.g., buffer layer 15 can be made thicker to prevent leakage and/or breakdown caused by the increased potential across the buffer layer). As such, the hybrid III-N device 100 can be assembled into the component package 200 without inclusion of a ceramic shim and with no more than three connectors, whereas conventional assembly approaches that require a ceramic shim or that are assembled without the via-hole 38 would require 4 or more connectors. This reduces the number of required components of the package (e.g. bill of materials or BOM), thereby reducing the overall assembly cost. The component package 200 of FIG. 3 shows a leaded package such as a TO-220 or TO-247. However, alternative embodiments with leadless packages can be used such as a quad flat no-lead (QFN), surface mount device (SMD) or loss-free package (LFPAK). Additionally the components of the package 200 may be oriented or arranged in a manner which best suits the needs of the designer and package type.

Figure 1:
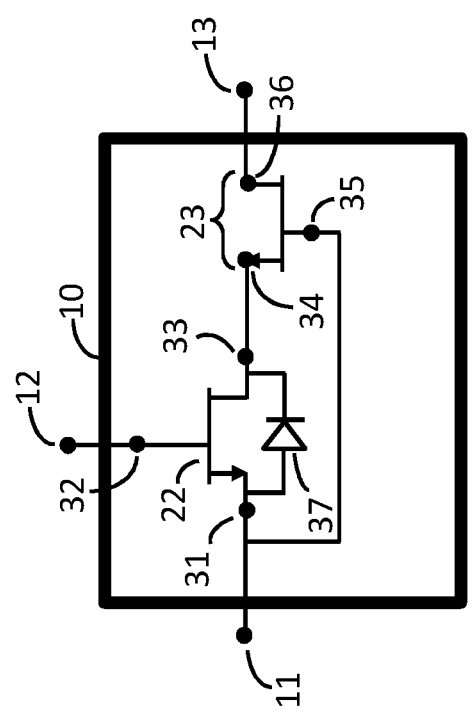
FIG. 1 is a schematic diagram of an electronic component of the prior art.
Figure 4:
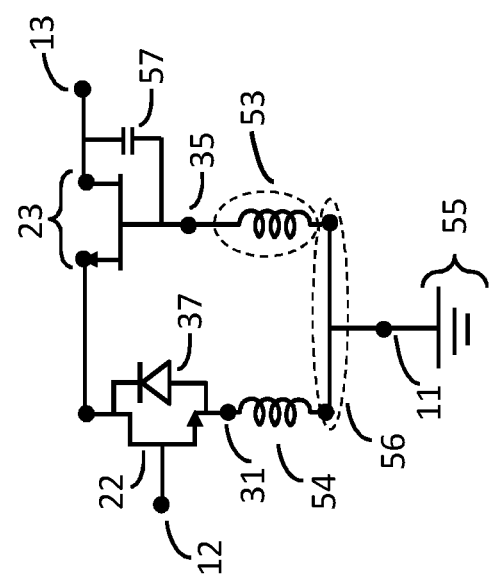
FIG. 4 is a schematic diagram of an electronic component.

FIG. 4 shows a circuit schematic of the hybrid device of FIG. 1 and also indicates various parasitic inductances and capacitances inherently present in the device. The parasitic gate-drain capacitance ($C_{GD}$) of the D-mode device 23 is represented as capacitor 57. The intrinsic body diode of the E-mode device 22 is represented by diode 37. The parasitic inductance of the source connection of E-mode device 22 is represented as inductor 54, and the parasitic inductance of the gate connection of D-mode device 23 is represented as inductor 53. When the circuit of FIG. 4 is implemented in a component package similar to package 200 of FIG. 3, the inductor 54 represents the inductance of the wire connecting the source 131 of E-mode device 122 to the package base 310 (e.g., wire 42 in FIG. 3), where the region enclosed by dashed line 56 in FIG. 4 represents the package base 310 of FIG. 3. The package source lead 311 can be connected to a circuit ground 55. In order for the gate electrode 35 of the D-mode device 23 to be connected to the source electrode 31 of the E-mode device 22, an external gate wire connector is used to connect the gate electrode 35 of the D-mode device 23 to the package source lead 11 (or to the package base). This gate wire connector results in a significant inductance (represented by inductor 53) between the gate electrode 35 of the D-mode device 23 and the package source lead 11 (or the package base). Parasitic inductances 53 and 54 can slow down the turn-on and turn-off time of the device and increase switching loss, thereby degrading the performance of the device.

In the hybrid device 100 shown in FIG. 2A, the gate electrode 135 of the D-mode device 123 is electrically connected to the substrate 14 by way of the via hole 38. Thus, when device 100 is implemented into package 200, as shown in FIG. 3, an external wire connector between the gate 135 of the D-mode device 123 and the package base 310 is not needed, since the gate 135 is electrically connected to the conductive substrate 14 and the conductive substrate 14 is directly mounted to (and thereby electrically connected to) the package base 310. Furthermore, the parasitic inductance of the gate connection to the substrate 14 through the via hole 38 is significantly reduced compared to the parasitic inductance 53 corresponding to the external connection required for the device of FIG. 1. As a result, the device 100 encased in component package 200 shows a substantial improvement in switching characteristics, reduced on-resistance degradation, and significantly lower packaging costs as compared to the device of FIG. 1 encased in package 100. Some of the switching performance improvements are described in further detail below.

FIGS. 5A, 5B, and 5C show three different modes of operating a half bridge buck converter circuit. The half bridge circuit includes a high-side switch 82 connected to a high voltage node 91 and a low-side switch 83 connected to a ground node 92. An inductor 93 is connected between node 94 (which is between the low-side switch 83 and the high-side switch 82) and the output node $V_{OUT}$ of the circuit. A first capacitor 86 is connected between the high-voltage node 91 and the DC ground 92. A second capacitor 87 is connected between the output node $V_{OUT}$ of the circuit the DC ground 92. The low-side switch 83 is selected to have properties that improve the efficiency of the buck converter circuit. Specifically, the switch 83 should have low on-resistance ($R_{DS(ON)}$) and low switching loss. The switch 83 can, for example, be the hybrid device of FIG. 1. Or, switch 83 can be implemented as the hybrid device 100 of FIGS. 2A-2C assembled in the component package 200 of FIG. 3.

The buck converter half bridge of FIGS. 5A-5C can be operated as follows: referring to FIG. 5A, in a first mode of operation, the gate of the high-side switch 82 is biased ON (i.e. $V_{GS}82>V_{TH}$) and the gate of the low-side switch 83 is biased OFF (i.e. $V_{GS}83<V_{TH}$). Current 97 flows from the high voltage node 91 in a forward direction through the high-side switch 83 to node 94. The current is blocked by the low-side switch 83 and flows through the inductor 93 as shown by current path 97. While the device is operated in the first mode of operation, if the gate-source voltage of the high-side switch 82 is switched to low or OFF (i.e., to $V_{GS}82<V_{TH}$), such that the gate of both switches 82 and 83 are biased OFF, the buck convertor switches to a second mode of operation shown in FIG. 5B. The current must continue to flow through the inductor 93.

Figure 6B:
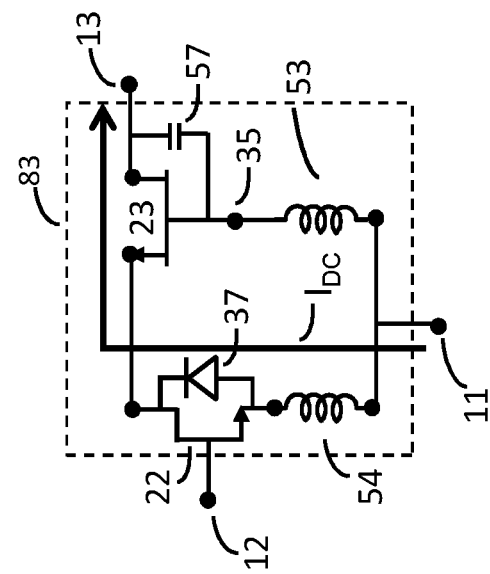
FIGS. 6A and 6B show schematic diagrams of current paths through a low-side switch of a half-bridge buck converter during different modes of operation.
Figure 6A:
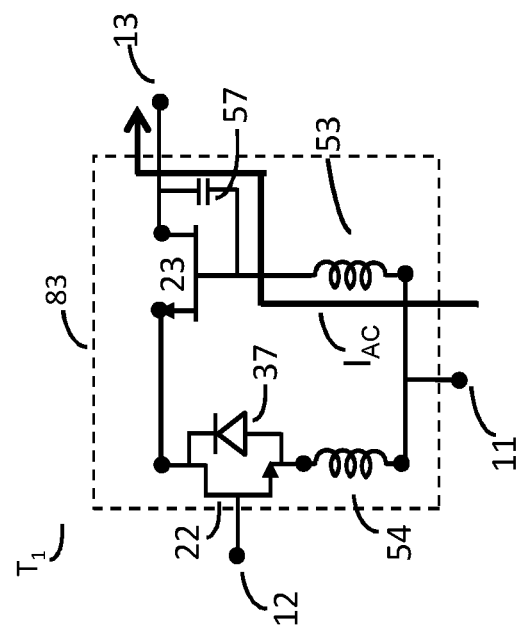

FIG. 6A illustrates the current path through the low-side switch 83 during a transition time Ti, between the first mode of operation and the second mode of operation shown in FIGS. 5A and 5B. During the transition time Ti, the voltage at node 94 (shown in FIGS. 5A-5C) is being pulled lower until it becomes negative and a displacement current flows though the parasitic gate-drain capacitor 57 of D-mode device 23, as shown by current path $I_{AC}$ in FIG. 6A. When the voltage at node 94 becomes sufficiently negative, the intrinsic body diode 37 of the E-mode device 22 is turned ON and the switch 83 becomes reverse conducting. This is referred to as reverse conduction mode (i.e. free-wheeling diode mode). At the end of the transition time Ti, switch 83 transitions from OFF to reverse conducting and the current abruptly transitions from a displacement current through the gate-drain capacitor 57 of D-mode device 22 into a reverse DC current which flows through the intrinsic body diode 37 of the E-mode device 22 and the channel of the D-mode device 23 as indicated by current path $I_{DC}$ in FIG. 6B. When the operating current through the inductor 93 is high, the current path transition can cause a voltage spike and ringing across the gate of the D-mode device 23. This voltage spike will inject charge into the gate dielectric 18 of the D-mode device 23 and result in an increase in the on-resistance (Rory) of the D-mode device, thereby increasing the on-resistance of the hybrid device. The reverse conduction of switch 83 is required in the circuit of FIG. 5B even though the gate of switch 83 is biased OFF because the current in inductor 93 has to be continuous.

Referring back to FIG. 5C after switching the gate of the high-side 82 OFF, as in FIG. 5B, the low-side switch 83 is switched ON (i.e., to $V_{GS}83>V_{TH}$), causing the buck converter to operate in a third mode of operation in which current continues to flow though the low-side switch 83 in the same direction (reverse direction) as the second mode but with the low-side switch 83 biased ON. Biasing the low-side switch ON during the third mode of operation reduces the voltage drop across the E-mode device 22 in the reverse direction as compared to the second mode of operation and allows a higher efficiency than compared to the second mode of operation. A sufficient dead time between turning the high-side switch 82 OFF and turning the low-side switch 83 ON is required to prevent accidentally shorting the high voltage rail to ground.

The design of the device and associated package can be a critical factor for determining the performance of the low-side switch 83 during reverse conduction mode. By implementing device 100 in package 200 as the low-side device 83, and thereby eliminating the need for an external gate wire connection between the D-mode device 23 and the package base (since the D-mode device gate is connected to the package base through via hole 38), parasitic inductance (shown by inductor 53) in the packaged device is reduced. This in turn reduces the voltage spike and ringing experienced by the gate of the D-mode device 23 during the current path transition between the first mode of operation and the second mode of operation. Surprisingly, this was shown to significantly lower the degradation (i.e. increase) of the on-resistance of the device when operated at very high reverse DC currents compared to conventional packages with an external gate wire. This result was unexpected. When device 100 is implemented in package 200 as the low-side switch 83, the switch 83 is capable of operating with a reverse DC current during the second and third mode of operation greater than 50 A, or even greater than 70 A, while exhibiting almost no increase in on-resistance. For example, the increase in on-resistance can be less than 5%. Conventional packages with an external gate wire connection can typically exhibit an increase of on-resistance of greater than 30% or more even while operating at reverse DC currents of 30A or less. The low-side switch 83 is capable of blocking a voltage greater than 600V during the first mode of operation. In addition, the high-side switch 82 can be the same type of switch as the low-side switch 83 but is not subjected to the same abrupt current transition conditions, and can be designed with less stringent requirements.

FIGS. 7A, 7B, and 7C show three different modes of operating a half bridge boost converter circuit. The half bridge circuit includes a high-side switch 84 connected to a high voltage node 91 and a low-side switch 85 connected to a ground node 92. An inductor 101 is connected between a node 102 (which is between the low-side switch 85 and the high-side switch 84) and the input node VIN of the circuit. A first capacitor 88 is connected between the input node VIN and the DC ground 92. A second capacitor 87 is connected between the high voltage node 91 and the DC ground 92. Here, unlike the buck converter, the high-side switch 84 needs to be carefully chosen to improve the efficiency of the boost converter circuit. Specifically, the switch 84 should have low on-resistance ($R_{DS(ON)}$) and low switching loss. The switch 85 can, for example, be the hybrid device of FIG. 1. Or, switch 85 can be implemented as the hybrid device 100 of FIGS. 2A-2C assembled in the component package 200 of FIG. 3.

The boost converter half bridge of FIGS. 7A-7C can be operated as follows: referring to FIG. 7A, in a first mode of operation, the gate of the high-side switch 84 is biased OFF (i.e. $V_{GS}84<V_{TH}$) and the gate of the low-side switch 85 is biased ON (i.e. $V_{GS}85<V_{TH}$). Current flows through the inductor 101 to node 102 and in a forward direction through the low-side switch 85 to ground 92, as shown by current path 103. While the device is operating in the first mode of operation, if the gate-source voltage of the low-side switch 85 is switched to low of OFF (i.e. to $V_{GS}85<V_{TH}$) such that the gate of both switches 84 and 85 are biased OFF, the boost converter switches to a second mode of operation shown in FIG. 7B. The current must continue to flow through the inductor 101.

The current path through the high-side switch 84 during the transition between the first mode of operation and the second mode of operation can be similar to the current paths described in FIGS. 6A and 6B. During the transition, the voltage at node 102 is being pulled higher and a displacement current flows through the parasitic gate-drain capacitor of the D-mode device used in switch 84. When the voltage at node 102 becomes sufficiently higher than the high-voltage node 91, the intrinsic body diode of the E-mode device used in switch 84 is turned ON and the switch 84 becomes reverse conducting. The behavior and effects of high side switch 84 during the transition from OFF to reverse conducting are similar to those described in the buck converter of FIG. 5A-5C and the low-side switch 83 of FIGS. 6A & 6B.

Referring back to FIG. 7C, after switching the gate of the low-side switch 85 OFF, as in FIG. 7B, the gate of the high-side switch 84 is switched ON (i.e. $V_{GS}84>V_{TH}$), causing the boost converter to operate in a third mode of operation, in which current continues to flow though the high-side switch 84 in the same direction as the second mode. Biasing the high-side switch ON during the third mode of operation reduces the voltage drop across the E-mode device of switch 84 in the reverse direction and allows a higher efficiency than compared to the second mode of operation. A sufficient dead time between turning the low-side switch 85 OFF and turning the high-side switch 84 ON is required to prevent accidentally shorting the high voltage rail to ground. When the hybrid device package component 200 is used as the high-side switch 84, the boost converter circuit of FIGS. 7A-7C is capable of supporting similar performance characteristics as those described in regards to the low-side switch 83 of FIGS. 5A-5C. In addition, the low-side switch 85 can be the same type of switch as the high-side switch 84 but is not subjected to the same abrupt current transition conditions, and can be designed with less stringent requirements.

Figure 8:
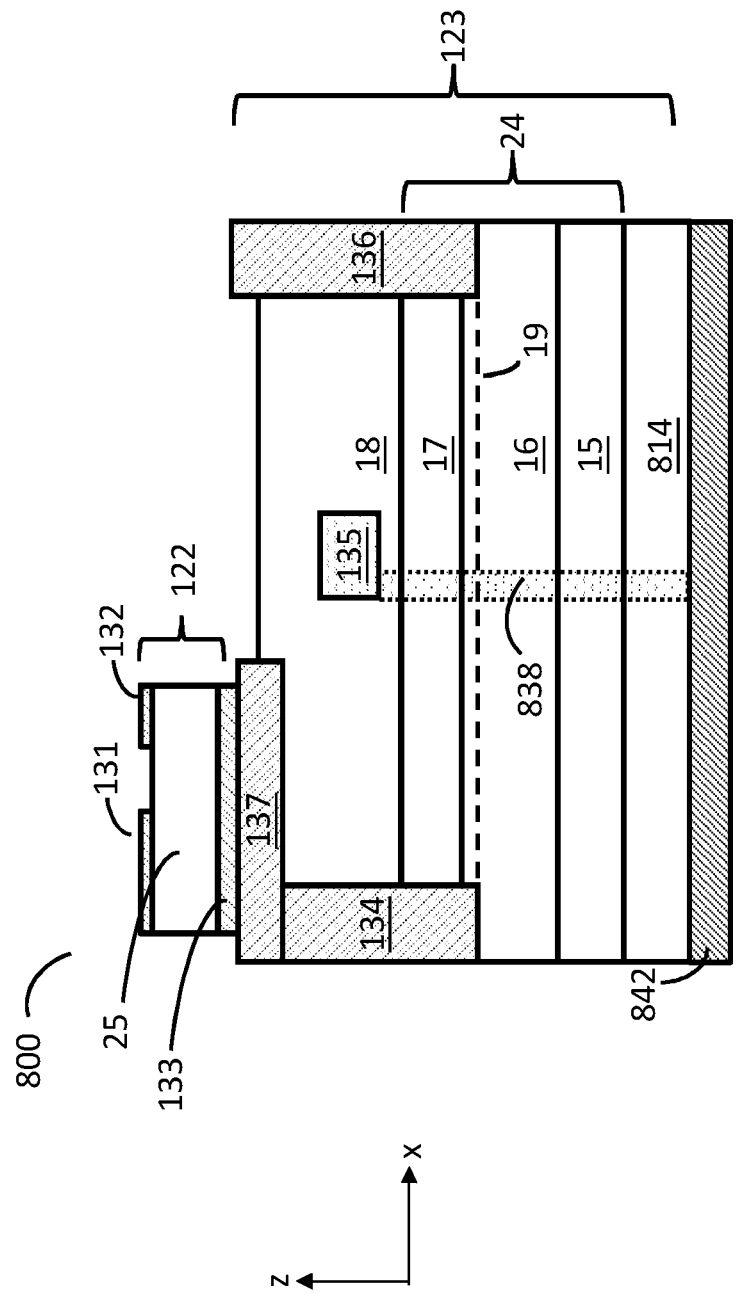
FIG. 8 is a cross-sectional view of another configuration for a hybrid III-N device.

Referring to FIG. 8, another configuration for a hybrid III-N device is shown. Device 800 of FIG. 8 is similar to device 100 of FIG. 2A, except that the III-N material structure 24 is fabricated on an insulating substrate 814 (e.g., a sapphire substrate) or a semi-insulating substrate (with resistivity≥1E5 Ω·cm), e.g., a silicon carbide substrate, instead of the conductive silicon substrate, as shown in FIG. 2A. As previously discussed for the packaged device 100 of FIG. 2A, the conductive silicon substrate 14 is grounded at 0V, resulting in the full gate-drain voltage being held across the buffer layer 15. This requires careful design considerations of the III-N buffer layer 15, which limits the high breakdown voltage of device 100. By using a sapphire (or other insulating or semi-insulating) substrate in device 800, the breakdown voltage of device 800 can be significantly greater than that of device 100. For example, the breakdown voltage of device 800 can be greater than 1200V, greater than 2400V, and in some specific design implementations, greater than 10 kV. Typical sapphire substrates have a nominal thickness of ~700 μm. However, the substrate 814 can be thinned down to improve the thermal performance of the substrate. For example, insulating substrate 814 can have a thickness of less than 200 μm.

In device 800, the gate via-hole 838 extends through an entire thickness of the III-N material structure 24 and an entire thickness of the insulating substrate 814 to allow the gate 135 of the D-mode device 123 to be electrically connected to the back metal layer 842. The back metal layer 842 can have similar properties, e.g., conductivity, to the back metal layer 42 of device 100, or alternatively layer 842 can be different. For example, back metal layer 842 can be a plated material such as a Ni or Cu layer with a thickness greater than 6 μm. The gate via-hole 838 can be formed in a similar area of the device as the gate via-hole 38, e.g., outside an active area of the device. The gate via-hole 838 can be formed using multiple different fabrication methods. For example, the gate via-hole 838 can be formed by etching (e.g. dry or wet etching) or laser ablation (or a combination of both) through the III-N material structure 24 and the substrate 814, forming a hole through a side of the substrate opposite the material structure 24.

Alternatively, the gate via-hole 838 can be formed by etching through an entire thickness of the III-N material structure 24 and partially etching through the substrate 814, for example by etching 200 μm into a 700 μm substrate. Next, the gate via-hole 838 is filled with a metal stack, such as Al, Ni, or Cu by sputter deposition or plating. Following a metal deposition step, the substrate 838 can be thinned down by grinding the side of the substrate opposite the III-N material stack to a thickness less than 200 μm, exposing the metal stack on the back surface of the substrate. After substrate thinning, the back metal layer 842 can be deposited where an electrical connection is made to the gate metal stack formed in the gate via-hole.

The back metal layer 842 can be formed on the side of the substrate opposite the III-N material layer 24 before or after the forming of the gate via-hole 838. The etching of the gate via-hole 838 can be followed by a metal deposition step which forms a metal stack on the back side of the substrate 814 and at least partially in the gate via-hole 838 from the backside, where the metal stack contacts the gate metal 135 of the III-N device 123.

The front side of the device and the back side of the device can be simultaneously double side Cu plated such that gate via-hole 838 is plated from the frontside of the device and the back metal layer 842 is plated from the backside of the device simultaneously in a single process step. The plated Cu layer can have a thickness of 10 μm or greater on both sides of the device. The gate via-hole 838, which extends through an entire thickness of the insulating substrate 814, allows device 800 to be implemented into a package similar to the package of device 200 of FIG. 3, such that the gate 135 of the D-mode III-N device 123 can be electrically connected to the package base 310 without the use of an external gate wire connector.

Figure 9:
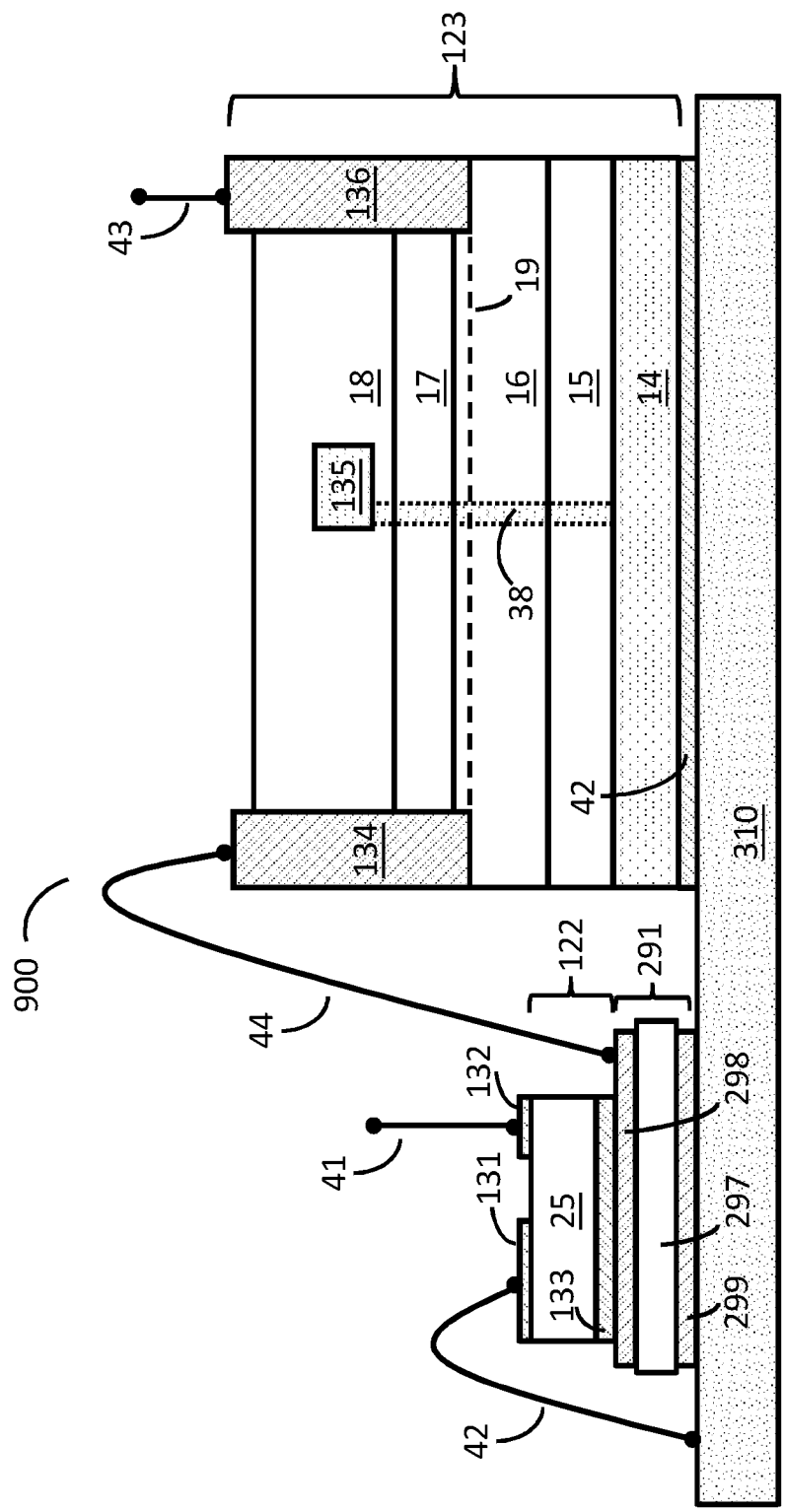
FIG. 9 is a cross-sectional view of another configuration for a hybrid III-N device.

Referring to FIG. 9, another embodiment of a hybrid III-N device is shown. Device 900 of FIG. 9 is similar to device 100 of FIG. 2A, except that the low-voltage E-mode device 122 and the high-voltage D-mode III-N device 123 are packaged in a "side-by-side" configuration in device 900 compared to a "die-on-die" configuration for device 100. As previously discussed for a "die-on-die" (e.g., device 100 of FIG. 2A), the E-mode device 122 is directly mounted on the source pad 137 of the D-mode device 123, so as to eliminate the need for an external wire connector to connect the source electrode 134 of the D-mode device to the FET drain electrode 133 of the E-mode device. However, in some applications the D-mode III-N device 123 may be too small to allow sufficient area for the E-mode FET 122 to be directly mounted to the source pad 137 on a top side of the D-mode device. For applications with these size limitations, the hybrid device can be arranged in a "side-by-side" configuration, as shown in FIG. 9.

A shim 291 is mounted between the E-mode device 122 and the package base 310. The shim can include a ceramic or insulating layer 297 (e.g., AlN) with metallic layers 298 and 299 on opposite sides of the insulating layer 297. Metal layer 299 serves as a bonding layer, thereby allowing the shim to be attached to the device package base 310, with solder, solder paste, conductive epoxy, conductive tape or another suitable attachment methods that allows for a high quality mechanical and thermal connection of the shim 291 to the device package base 310. The drain electrode 133 of device 122 is mounted to metallic layer 298 on the top side of the insulating shim 291 with solder, solder paste, conductive epoxy, conductive tape or another suitable attachment method. The source electrode 134 of the III-N device 123 is electrically connected to the drain electrode 133 of the E-mode device 122 with wire connector 44, which extends from the source electrode 134 to the top metalized surface 298 of the insulating shim 291. This causes the source electrode 134 and the FET drain electrode 133 to be electrically connected. The remaining wire connections and configurations of device 900 can be similar to those of device 100 of FIG. 2A. Device 900 can have an advantage over device 100 by in that the use of smaller/cheaper III-N HEMTs can be enabled. However, device 900 may also require increased packaging complexity compared to device 100.

Figure 10:
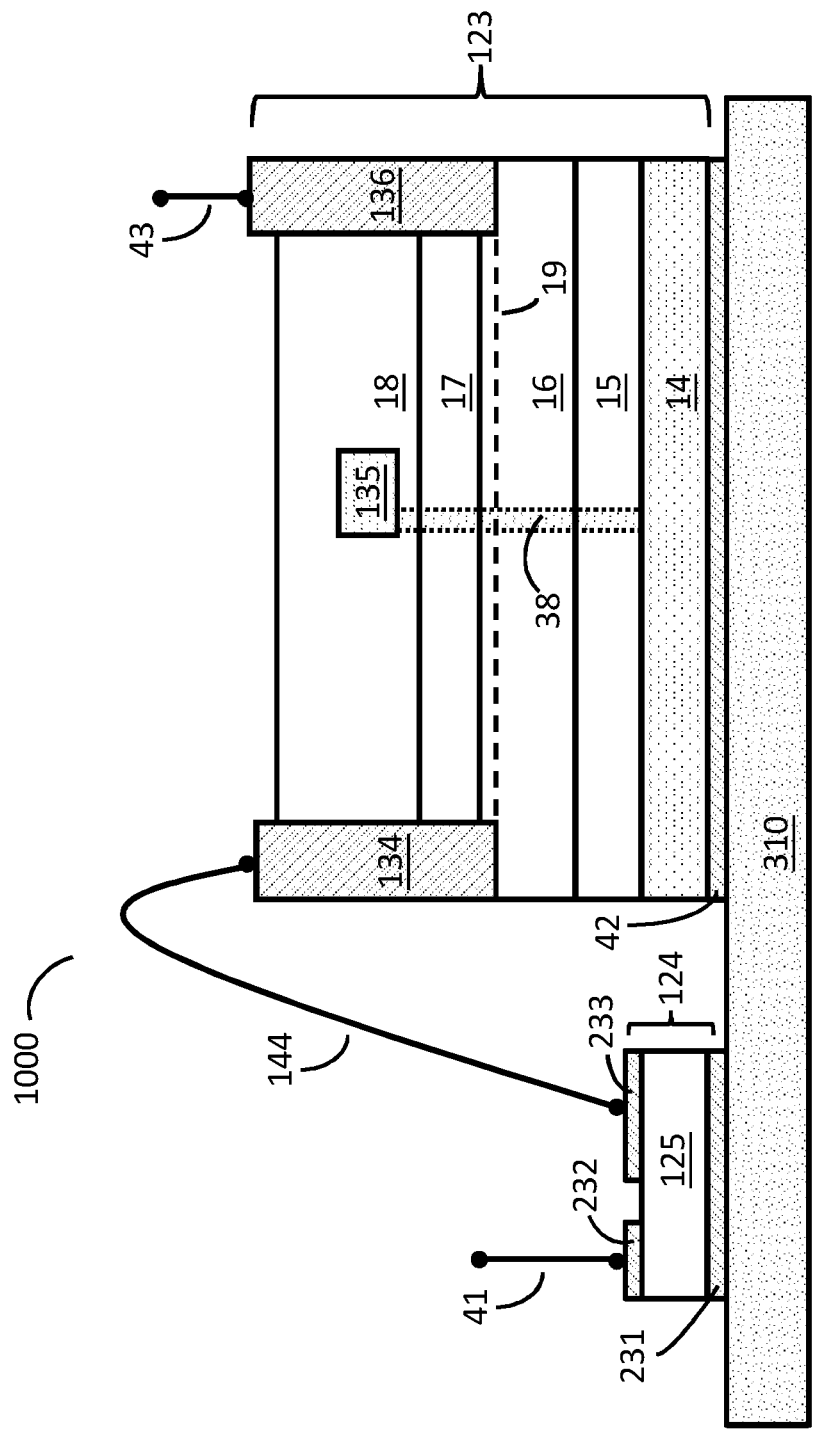
FIG. 10 is a cross-sectional view of another configuration for a hybrid III-N device.

Another hybrid III-N device 1000 is shown in FIG. 10. Device 1000 of FIG. 10 is similar to device 900 of FIG. 9, except that an alternative design for the low-voltage E-mode device is implemented, thereby enabling the E-mode device and the D-mode device to be packaged in a "side-by-side" configuration without the use of a ceramic shim. Typical silicon MOSFETs, such as FET 122 of device 900, are vertical devices that are fabricated such that the FET drain 133 is on the bottom side of the semiconductor body 25, and the FET gate 132 and FET source 131 are on the top side of the semiconductor body 25. However, device 1000 is implemented using a silicon MOSFET with an alternative semiconductor body 125, where the FET source electrode 231 is on a one side, e.g., the bottom, of the semiconductor body 125, and the FET gate electrode 232 and the FET drain electrode 233 are both on the same side, e.g., the top, of the semiconductor body 125 opposite the FET source electrode 231, to form an inverted E-mode FET 124. As such, FET 124 can be implemented into device 1000 to eliminate the insulating shim 291 and the source connector 42, that are included in device 900.

As seen in FIG. 10, the source electrode 231 of inverted E-mode FET 124 is directly mounted and electrically connected to the conductive structural package base 310, with solder, solder paste, conductive epoxy, conductive tape or another suitable attachment method which allows for a high quality mechanical, thermal, and electrical connection between FET 124 and the package base 310. The source electrode 134 of the III-N device 123 is connected to the drain electrode 233 of the E-mode FET 124 with wire connector 144. The device 1000 can be advantageous compared to device 900 in that the packaging complexity and cost are reduced due to the elimination of several packaging components, including the insulating shim 291 and the source connector 42, shown in FIG. 9.

A number of implementations have been described. Nevertheless, it will be understood that various modifications may be made without departing from the spirit and scope of the techniques and devices described herein. Accordingly, other implementations are within the scope of the following claims.

What is claimed is:
1. A semiconductor device, comprising:
a III-N device comprising a conductive substrate on a first side of a III-N material structure that includes an electrically insulating buffer layer, and a first gate, a first source, and a first drain over a second side of the III-N material structure opposite the substrate, wherein the first source is electrically separated from the conductive substrate by the electrically insulating buffer layer;
a field effect transistor (FET) comprising a second semiconductor material structure, and second gate, a second source, and a second drain, the second source and the second gate being over an opposite side of the second semiconductor material structure from the second drain, wherein the second drain of the FET is physically mounted and electrically connected to a source pad of the first source of the III-N device; and
a via-hole extending through a portion of the III-N material structure and terminating at the conductive substrate, wherein the first gate is electrically connected to the conductive substrate by a metal layer formed in the via-hole.

2. The semiconductor device of claim 1, wherein the substrate is doped p-type with a hole concentration greater than $1\times10^{19}$ holes/cm$^3$.

3. The semiconductor device of claim 2, wherein the substrate is configured to be electrically coupled to a circuit ground through a back metal layer.

4. The semiconductor device of claim 1, wherein the III-N material structure comprises the electrically insulating buffer layer, a III-N channel layer, and a III-N barrier layer, wherein the buffer layer is doped with iron, magnesium, or carbon.

5. The semiconductor device of claim 4, wherein a compositional difference between the III-N barrier layer and the III-N channel layer causes a lateral 2DEG channel to be induced in the III-N channel layer, and the first source and first drain are electrically connected to the 2DEG channel.

6. The semiconductor device of claim 4, wherein the electrically insulating buffer layer has a thickness greater than 4 µm.

7. The semiconductor device of claim 1, wherein the second drain of the FET is electrically connected to the source pad of the first source of the III-N device by solder, solder paste or conductive epoxy.

8. The semiconductor device of claim 1, wherein a top surface of the first gate is fully encapsulated in a dielectric material.

9. The semiconductor device of claim 1, wherein the III-N material structure is orientated in a N-Polar orientation.

10. The semiconductor device of claim 1, wherein the III-N device further comprises an active region between the first source and the first drain, and the via-hole is formed outside the active region.

11. The semiconductor device of claim 10, wherein the FET is at least partially over the active region of the III-N device.

12. The semiconductor device of claim 7, wherein the solder, solder paste or conductive epoxy both electrically connects and physically secures the second drain of the FET to the source pad of the first source of the III-N device.

13. The semiconductor device of claim 7, wherein the second drain of the FET is electrically connected to the source pad of the first source of the III-N device without a wire connector.

* * * * *